United States Patent
Takizawa et al.

(10) Patent No.: US 7,842,532 B2
(45) Date of Patent: Nov. 30, 2010

(54) NITRIDE SEMICONDUCTOR DEVICE AND METHOD FOR MANUFACTURING THE SAME

(75) Inventors: Toshiyuki Takizawa, Kyoto (JP); Jun Shimizu, Kyoto (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/608,625

(22) Filed: Oct. 29, 2009

(65) Prior Publication Data

US 2010/0178756 A1    Jul. 15, 2010

Related U.S. Application Data

(62) Division of application No. 11/698,209, filed on Jan. 26, 2007, now abandoned.

(30) Foreign Application Priority Data

Jan. 26, 2006  (JP)  .............................. 2006-017193
Jan. 31, 2006  (JP)  .............................. 2006-023029

(51) Int. Cl.
    *H01L 21/20*    (2006.01)
(52) U.S. Cl. ........................ 438/47; 438/46; 438/172; 257/E21.09; 257/E21.093; 257/E21.098; 257/E21.11
(58) Field of Classification Search .................. 438/46, 438/47, 172; 257/E21.09, E21.093, E21.098, 257/E21.11
See application file for complete search history.

(56) References Cited

U.S. PATENT DOCUMENTS 6,072,818 A  *  6/2000  Hayakawa ............. 372/46.014
6,734,503 B2     5/2004  Hata et al.
6,977,953 B2    12/2005  Hata et al.

FOREIGN PATENT DOCUMENTS

JP          2828002         9/1998

OTHER PUBLICATIONS

Shuji Nakamura, et al., "Superbright Green InGaN Single-Quantum-Well-Structure Light-Emitting Diodes", Jpn. J. Appl. Phys. vol. 34 (1995) pp. L1332-L1335.
Shuji Nakamura, et al., "InGaN/GaN/AlGaN-Based Laser Diodes With Modulation-Doped Strained-Layer Superlattices Grown on an Epitaxially Laterally Overgrown GaN Substrate".

* cited by examiner

*Primary Examiner*—Wael M Fahmy
*Assistant Examiner*—Minchul Yang
(74) *Attorney, Agent, or Firm*—McDermott Will & Emery LLP

(57) ABSTRACT

A nitride semiconductor device includes: a substrate having a principal surface; a first nitride semiconductor layer formed on the principal surface of the substrate and includes one or more convex portions whose side surfaces are vertical to the principal surface; and a second nitride semiconductor layer selectively grown on the side surfaces of the one or more convex portions of the first nitride semiconductor layer.

12 Claims, 9 Drawing Sheets

NITRIDE SEMICONDUCTOR DEVICE AND METHOD FOR MANUFACTURING THE SAME

CROSS-REFERENCE TO RELATED APPLICATIONS

This application is a Divisional of U.S. application Ser. No. 11/698,209, filed on Jan. 26, 2007 now abandoned, claiming priority to Japanese Patent Application Nos. 2006-017193, filed on Jan. 26, 2006 and 2006-023029, filed on Jan. 31, 2006, the entire contents of each are hereby incorporated by reference.

BACKGROUND OF THE INVENTION

1. Field of the Invention

The present invention relates to a nitride semiconductor device using a nitride semiconductor and a method for manufacturing the same.

2. Description of Related Art

A semiconductor light emitting device using a nitride semiconductor has already been practically used as a light emitting diode in various kinds of fields because it is able to emit light over wide wavelength ranges from ultraviolet to blue or green visible light by suitably controlling the composition of the nitride semiconductor.

As the nitride semiconductor has a large band gap and a deep acceptor level, it is difficult to reduce the resistance of a p-type layer. However, in order to reduce the operating voltage of a light emitting diode having a p-n junction, it is essential to reduce the resistance of the p-type layer and contact resistance between the p-type layer and an ohmic electrode.

Hereinafter, as a first conventional example, a light emitting diode using a nitride semiconductor is explained with reference to drawings (see, for example, Shuji Nakamura et al., "Superbright green InGaN single-quantum-well-structure light-emitting diodes", Jpn. J. Appl. Phys. Vol. 34 (1995) L.1332-L.1335).

FIG. 14 shows the sectional structure of the first conventional example of the light emitting diode using a nitride semiconductor. As shown in FIG. 14, the conventional light emitting diode includes a sapphire substrate 101 having a (0001) plane as a principal surface. On the principal surface of the sapphire substrate 101, a GaN buffer layer 102 which grows at low temperatures, an n-type GaN layer 103, an InGaN quantum well active layer 104, a p-type cladding layer 105 made of p-type AlGaN and a p-type contact layer 106 made of p-type GaN are formed in this order. A p-type electrode 107 is formed on the p-type contact layer 106 and an n-type electrode 108 is formed on a selectively exposed part of the n-type GaN layer 103.

In the first conventional example, the p-type cladding layer 105 contains magnesium (Mg) as p-type dopants and heat treatment is carried out in nitrogen atmosphere to obtain a p-type semiconductor layer.

As a second conventional example of a semiconductor device using the nitride semiconductor, a blue-violet semiconductor laser device has already come into practical use. Commonly used blue-violet semiconductor laser devices have a ridge waveguide structure as disclosed by Shuji Nakamura et al., "InGaN/GaN/AlGaN-based laser diodes with modulation-doped strained-layer superlattices grown on an epitalixally laterally overgrown GaN substrate", Appl. Phys. Lett. Vol. 72 (1998) pp. 211-213. In this structure, a p-type semiconductor layer on an active layer is patterned into a convex stripe in order to narrow a current flow and trap emitted light. The blue-violet semiconductor laser device is achieved by a relatively easy process.

However, the light emitting diode using the nitride semiconductor of the first conventional example has limitations in reducing the resistance of the p-type contact layer 106 and the contact resistance between the p-type contact layer 106 and the p-type electrode 107. Therefore, it is difficult to reduce the operating voltage to a further extent. Likewise, it is not easy to reduce the resistance of the p-type contact layer in the semiconductor laser device using the nitride semiconductor. Thus, difficulty remains in improving characteristics, efficiency and reliability of the laser device.

In the semiconductor laser device using the nitride semiconductor of the second conventional example, the ridge waveguide structure having a convex section is provided by dry etching. Therefore, it is difficult to control the thickness of parts of the p-type semiconductor layer remaining on the sides of the ridge. This leads to variations in threshold current in the semiconductor laser device and variations in angle of light emission.

Moreover, since the p-type semiconductor layer is made of a nitride semiconductor which is not suitable for easily producing a low resistance p-type semiconductor layer, the series resistance of the p-type semiconductor layer is increased. Further, electrooptic characteristics and reliability of the laser device may possibly deteriorate due to damage caused by the dry etching for forming the ridge. Thus, the semiconductor laser device of the second conventional example has limitations in improving yield and reducing the operating voltage.

SUMMARY OF THE INVENTION

In order to solve the above-described conventional problems, the present invention makes it possible to reduce the resistance of the p-type contact layer and produce a semiconductor laser device having a current confining structure without patterning the p-type semiconductor layer into ridge shape.

In order to achieve the above-described object, the present invention provides a nitride semiconductor device by selectively growing a second nitride semiconductor layer on the side surfaces of a convex portion of a first nitride semiconductor layer.

To be more specific, the nitride semiconductor device of the present invention includes: a substrate having a principal surface; a first nitride semiconductor layer formed on the principal surface of the substrate and includes one or more convex portions whose side surfaces are vertical to the principal surface; and a second nitride semiconductor layer selectively grown on the side surfaces of the one or more convex portions of the first nitride semiconductor layer.

In the nitride semiconductor device of the present invention, the second nitride semiconductor layer is selectively grown on the side surfaces of the one or more convex portions using an organic nitride material. As described later, the thus-formed second nitride semiconductor layer improves the activation rate of p-type dopants and reduces the resistance thereof.

If the conventionally used current confining structure provided on a p-type semiconductor layer formed on an active layer is replaced with the first nitride semiconductor layer of the present invention having the one or more convex portions and n-type conductivity, the need of patterning the p-type semiconductor layer into ridge shape is eliminated. As a result, a large region of the p-type semiconductor layer is surely kept for current injection. This makes it possible to reduce the series resistance and the operating voltage of the device to a notable degree.

As to the nitride semiconductor device of the present invention, it is preferable that the side surfaces of the one or more convex portions are provided by forming protrusions and depressions in at least a top portion of the first nitride semiconductor layer, the first and second nitride semiconductor layers have a p-type conductivity and the second nitride semiconductor layer has a higher p-type carrier concentration than the first nitride semiconductor layer.

This configuration makes it possible to reduce the resistance of the p-type second nitride semiconductor layer.

As to the nitride semiconductor device of the present invention, it is preferable that the side surfaces of the one or more convex portions are provided by forming protrusions and depressions in at least a top portion of the first nitride semiconductor layer, the first and second nitride semiconductor layers have a p-type conductivity and the second nitride semiconductor layer has a lower residual hydrogen concentration than the first nitride semiconductor layer.

Since the hydrogen concentration which may inactivate the p-type dopants in the second nitride semiconductor layer is low, the resistance of the p-type second nitride semiconductor layer is reduced.

As to the nitride semiconductor device of the present invention, it is preferable that the side surfaces of the one or more convex portions are provided by forming protrusions and depressions in at least a top portion of the first nitride semiconductor layer, the first and second nitride semiconductor layers have a p-type conductivity and the composition of the first nitride semiconductor layer is $Al_xGa_{1-x}N$ (wherein $0 \leq x \leq 1$) and the composition of the second nitride semiconductor layer is $Al_xGa_{1-x}N_yP_zAs_{1-y-z}$ (wherein $0 \leq x, y, z \leq 1$ and $0 < y+z < 1$).

With this configuration, a localized band occurs in the second nitride semiconductor layer by the effect of phosphorus (P) or arsenic (As). Therefore, the resistance of the p-type second nitride semiconductor layer is further reduced.

As to the nitride semiconductor device of the present invention, it is preferable that the side surfaces of the one or more convex portions are provided by forming protrusions and depressions in at least a top portion of the first nitride semiconductor layer, the first and second nitride semiconductor layers have a p-type conductivity and the second nitride semiconductor layer has a higher refractive index than the first nitride semiconductor layer.

When the protrusions and depressions are formed in at least a top portion of the first nitride semiconductor layer, it is preferable that the nitride semiconductor device further includes: an electrode formed on the second nitride semiconductor layer in contact with the second nitride semiconductor layer, wherein the second nitride semiconductor layer is formed to bury the protrusions and depressions.

In this case, it is preferable that the protrusions and depressions provide a photonic crystal structure.

The photonic crystal structure with a high refractive index has the function of trapping light and the emitted light is taken out with improved efficiency. Therefore, the characteristics of the device are improved.

In this case, it is preferable that the first and second nitride semiconductor layers are configured to form a ridge stripe extending in a certain direction.

In this case, it is preferable that the protrusions and depressions extend in a direction vertical to the certain direction and are arranged periodically along the certain direction.

With the thus-configured first and second nitride semiconductor layers, a distributed feedback laser device is achieved with a diffraction grating provided by the protrusions and depressions having different refractive indices.

As to the nitride semiconductor device of the present invention, it is preferable that the side surfaces of the one or more convex portions of the first nitride semiconductor layer have a (000–1), (11–20) or (1–100) plane orientation. In this specification, the minus sign "–" added to the Miller index represents the inversion of the Miller index following the minus sign for convenience sake.

After various elaborate studies, the inventors of the present invention have found that, if an organic nitride material is used as a nitrogen source for the nitride semiconductor layer instead of ammonia, the nitride semiconductor layer hardly grows on a (0001) plane, while it grows on a (000–1), (11–20) or (1–100) plane. Therefore, if the side surfaces of the one or more convex portions of the first nitride semiconductor layer have a (000–1), (11–20) or (1–100) plane orientation, the second nitride semiconductor layer surely grows on the side surfaces of the convex portions.

As to the nitride semiconductor device of the present invention, it is preferable that the first nitride semiconductor layer has a first conductivity type and includes a ridge stripe extending in a certain direction, the second nitride semiconductor layer is an overhanging semiconductor layer which is grown on the side surfaces of the ridge stripe of the first nitride semiconductor layer in a direction parallel to the principal surface of the substrate and the nitride semiconductor device further includes a third nitride semiconductor layer formed to cover the top surfaces of the ridge stripe and the overhanging semiconductor layer and includes an active layer.

With this configuration, the current is more likely to flow through the first nitride semiconductor layer than through the overhanging semiconductor layer. Therefore, the overhanging semiconductor layer, which is the second nitride semiconductor layer grown on the side surfaces of the one or more convex portions of the first nitride semiconductor layer, functions as a current confining structure. Further, as there is no need of etching the first nitride semiconductor layer, the top surface of the first nitride semiconductor layer is flat at an atomic layer level. As a result, an active layer is formed on the first nitride semiconductor layer with excellent crystallinity, thereby improving the light emitting efficiency of the device. Further, since the current confining structure by the overhanging semiconductor layer is formed below the third nitride semiconductor layer, there is no need of patterning or processing the third nitride semiconductor layer including the active layer. This eliminates damage to the active layer, thereby reducing the electric resistance and operating voltage of the device.

Since the convex portion of the first nitride semiconductor layer is in the form of a ridge stripe, the overhanging semiconductor layer is formed on the side surfaces of the ridge stripe of the first nitride semiconductor layer. Therefore, the operating current is injected uniformly and effectively in the direction of extension of the ridge stripe, thereby improving the light emitting efficiency of the device.

In this case, it is preferable that the overhanging semiconductor layer is insulative or has a second conductivity type.

With this configuration, a high efficiency current confining structure is achieved below the active layer. This improves the light emitting efficiency to a further extent.

If the first nitride semiconductor layer has the ridge stripe, it is preferable that part of the overhanging semiconductor layer has a larger band gap than the first nitride semiconductor layer.

With this configuration, a high efficiency current confining structure is achieved below the active layer. This improves the light emitting efficiency to a further extent.

In this case, it is preferable that the composition of the overhanging semiconductor layer is varied periodically in a direction away from the side surfaces of the ridge stripe of the first nitride semiconductor layer.

With this configuration, the band structure of the overhanging semiconductor layer is also varied periodically in an electron energy level. This makes it difficult for the carriers to enter the overhanging semiconductor layer. As a result, the overhanging semiconductor layer functions as the current confining structure, thereby improving the light emitting efficiency of the device.

In this case, it is preferable that the composition of the overhanging nitride semiconductor layer is varied continuously in a direction away from the side surfaces of the ridge stripe of the first nitride semiconductor layer such that the band gap of the overhanging semiconductor layer is continuously increased.

With this configuration, in part of the overhanging semiconductor layer at a larger distance from the first nitride semiconductor layer through which the current flows, the band gap of the overhanging semiconductor layer becomes larger and the refractive index thereof becomes lower. Therefore, the overhanging semiconductor layer functions as not only the current confining structure but also a distributed refractive index type waveguide. As a result, the overhanging semiconductor layer improves not only the characteristics by the carrier trapping effect of the current confining structure but also the light confining efficiency.

In this case, it is preferable that a gap is formed between parts of the first nitride semiconductor layer on the sides of the ridge stripe and the overhanging semiconductor layer.

With this configuration, parts of the first nitride semiconductor layer on the sides of the ridge stripe and the overhanging semiconductor layer are completely spatially isolated from each other. This improves the efficiency of the current confining function of the overhanging semiconductor layer. Further, with the gap formed between the first nitride semiconductor layer and the overhanging semiconductor layer, parasitic capacitance of the overhanging semiconductor layer on the device is also reduced, thereby improving high frequency characteristic of the device.

In this case, it is preferable that the top surface of the ridge stripe of the first nitride semiconductor layer has a (0001) plane orientation.

With this configuration, the side surfaces of the convex portion of the first nitride semiconductor layer are at least one of a (1–100) plane and a (11–20) plane. In this case, a high quality second nitride semiconductor layer is selectively epitaxially grown on the side surfaces of the convex portion in a direction parallel to the principal surface of the substrate by organic metal chemical vapor deposition using an organic nitride material as a nitrogen source. This makes it possible to achieve a current confining structure by the overhanging semiconductor layer below the third nitride semiconductor layer including the active layer with ease and reliability. As a result, the manufacturing process is simplified, the manufacturing cost is reduced and the device characteristics are improved at the same time.

In this case, it is preferable that the top surface of the ridge stripe of the first nitride semiconductor layer has periodic protrusions and depressions.

With this configuration, periodic modulation of refractive index distribution is caused by the periodic protrusions and depressions provided in the top surface of the ridge stripe. Therefore, light emitted from the active layer and having a particular wavelength is reflected intensely under the Bragg condition. As a result, laser oscillation having a single wavelength is achieved without additional complicated processes.

In this case, it is preferable that the width of the ridge stripe of the first nitride semiconductor layer is varied continuously along the certain direction.

With this configuration, the shape of the waveguide is designed with increased flexibility in response to the angle of light emission or required optical output. For example, a high optical output with a small angle of light emission is easily achieved by reducing the width of the output end of the ridge stripe, while the other part is made wide. Thus, in addition to the high efficiency operation of the device and the reduction in resistance, the design flexibility of the laser device is also improved.

In this case, it is preferable that the width of the ridge stripe of the first nitride semiconductor layer is varied periodically along the certain direction.

With this configuration, periodical modulation of an equivalent refractive index of the waveguide is caused by the periodic change in width of the ridge. This brings about intense Bragg reflection of light of a particular single wavelength. As a result, a semiconductor laser device with excellent monochromaticity is obtained.

In this case, it is preferable that part of the first nitride semiconductor layer and the other part of the first nitride semiconductor layer aligned along the direction vertical to the principal surface of the substrate have compositions different from each other.

With this configuration, a distributed refractive index type structure is achieved by providing a multiquantum barrier made by a short-period superlattice structure in at least part of the first nitride semiconductor layer or by continuously changing the composition of the first nitride semiconductor layer in the direction vertical to the principal surface of the substrate. This structure makes it possible to further improve the current injection efficiency together with the current confining structure.

In this case, it is preferable that the side surfaces of the ridge stripe of the first nitride semiconductor layer have at least a single plane orientation.

With this configuration, during the selective growth of the overhanging semiconductor layer as the second nitride semiconductor layer on the side surfaces of the convex portion (ridge stripe) formed in the first nitride semiconductor layer, the crystal growth is achieved only on a certain crystal plane of the side surfaces of the convex portion. As a result, the gap between the overhanging semiconductor layer and the parts of the first nitride semiconductor layer on the sides of the convex portion may be enlarged. Therefore, an efficient current confining structure is achieved with an improvement in high frequency characteristic by the significant reduction in parasitic capacitance.

In this case, it is preferable that the top surface of the ridge stripe of the first nitride semiconductor layer is lower than the top surface of the overhanging semiconductor layer.

With this configuration, part of the active layer included in the third nitride semiconductor layer on the first nitride semiconductor layer is provided lower than part of the active layer on the overhanging nitride semiconductor layer. This improves the current confining effect of the overhanging semiconductor layer to a further extent, thereby improving the light emitting efficiency of the device.

In this case, it is preferable that part of the active layer located above the ridge stripe has a longer adsorption edge wavelength than part of the active layer located above the overhanging semiconductor layer.

With this configuration, part of the active layer above the first nitride semiconductor layer shows the lowest potential energy. Therefore, current that flows transversely, even if the current confining structure is provided, is effectively collected. Further, since part of the active layer above the overhanging semiconductor layer has a light emitting wavelength shifted to the shorter side, the refractive index and the optical absorption of the part are reduced. Thus, the light emitting efficiency of the device is improved.

In this case, it is preferable that the overhanging semiconductor layer has a lower residual hydrogen concentration than the first nitride semiconductor layer.

With this configuration, acceptors in the overhanging semiconductor layer are less likely to bind with residual hydrogen, thereby increasing the activation rate of the p-type conductivity. Further, this eliminates the step of annealing for activating the acceptors after the selective growth of the overhanging semiconductor layer on the side surfaces of the convex portion of the first nitride semiconductor layer.

As to the nitride semiconductor device of the present invention, it is preferable that the second nitride semiconductor layer is formed using an organic nitride material as a nitrogen source.

In this case, it is preferable that the organic nitride material contains asymmetric dimethylhydrazine or asymmetric dibutylhydrazine as a main ingredient.

A first method for manufacturing a nitride semiconductor device according to the present invention includes the steps of: forming a first nitride semiconductor layer on a substrate; forming one or more convex portions in at least a top portion of the first nitride semiconductor layer; and selectively growing a second nitride semiconductor layer on the side surfaces of the one or more convex portions of the nitride semiconductor layer using an organic nitride material as a nitrogen source after the step of forming the one or more convex portions.

According to the first manufacturing method, the organic nitride material is used as the nitrogen source such that the second nitride semiconductor layer is selectively grown on the side surfaces of the one or more convex portions of the first nitride semiconductor layer. Thus, the second nitride semiconductor layer is provided with excellent crystallinity.

As to the first manufacturing method, it is preferable that the side surfaces of the one or more convex portions of the first nitride semiconductor layer have a (000–1), (11–20) or (1–100) plane orientation.

With this configuration, the second nitride semiconductor layer is selectively grown on the side surfaces of the first nitride semiconductor layer.

A second method for manufacturing a nitride semiconductor layer includes the steps of: forming on a substrate a first nitride semiconductor layer whose principal surface has a (000–1), (11–20) or (1–100) plane orientation and growing a second nitride semiconductor layer on the first nitride semiconductor layer using an organic nitride material as a nitrogen source after the step of forming the first nitride semiconductor layer.

According to the second manufacturing method, the organic nitride material is used as the nitrogen source such that the second nitride semiconductor layer is selectively grown on the side surfaces of the one or more convex portions of the first nitride semiconductor layer. Thus, the second nitride semiconductor layer is provided with excellent crystallinity.

As to the first or second manufacturing method, it is preferable that the first and second nitride semiconductor layers have a p-type conductivity and at least one of phosphorus and arsenic is added to the second nitride semiconductor layer in the step of forming the second nitride semiconductor layer.

With this configuration, the second nitride semiconductor layer having a localized band is formed by crystal growth.

In this case, it is preferable that an organic phosphorus material is used as a phosphorus source and an organic arsenic material is used as an arsenic source in the step of forming the second nitride semiconductor layer.

With this configuration, the second nitride semiconductor layer contains phosphorus or arsenic, thereby improving the crystallinity.

As to the first or second manufacturing method, it is preferable that the organic nitride material is asymmetric dimethylhydrazine or asymmetric dibutylhydrazine.

With this configuration, the nitride semiconductor crystal is obtained with excellent crystallinity.

DETAILED DESCRIPTION OF THE INVENTION

First Embodiment

Hereinafter, explanation of a first embodiment of the present invention is provided with reference to the drawings.

Figure 1:
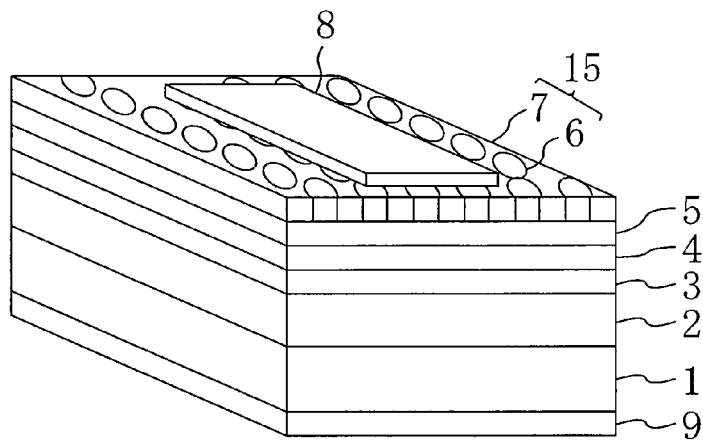
FIG. 1 is an oblique view illustrating a light emitting diode as a nitride semiconductor device of a first embodiment of the present invention.

FIG. 1 shows a light emitting diode using a nitride semiconductor as a first embodiment of the present invention.

As shown in FIG. 1, on a principal surface of an n-type semiconductor 1 made of n-type gallium nitride (GaN) and having a (0001) plane direction, a 3 μm thick n-type gallium nitride (GaN) layer 2, a 100 nm thick n-type cladding layer 3 made of n-type aluminum gallium nitride (AlGaN), a multiple quantum well (MQW) active layer 4 made of indium gallium nitride (InGaN), a 500 nm thick p-type cladding layer 5 made of p-type aluminum gallium nitride (AlGaN) and a 100 nm thick p-type contact layer 15 are formed in this order.

The p-type contact layer 15 includes a plurality of first p-type contact layers 6 made of p-type gallium nitride (GaN) and patterned into column shape, respectively, and a second p-type contact layer 7 which is selectively grown on the side surfaces of the first p-type contact layers 6 and made of p-type aluminum gallium nitride phosphide in which phosphorus (P) is added to the group V element (AlGaNP).

As a nitrogen source for the second p-type contact layer 7, an organic nitride material is used in place of generally used ammonia ($NH_3$). Examples of the organic nitride material include asymmetric dimethylhydrazine (($CH_3$)$_2NNH_2$: DMHy) and asymmetric dibutylhydrazine (($C_4H_9$)$_2NNH_2$: DBHy).

A p-type electrode 8 is formed on the p-type contact layer 15. The p-type electrode 8 is a transparent electrode made of ITO (indium tin oxide) or a stack of nickel (Ni) and gold (Au). Further, an n-type electrode 9 made of a stack of titanium (Ti) and aluminum (Al) is formed on the surface of the n-type substrate 1 opposite the n-type GaN layer 2.

Now, a method for manufacturing the thus-configured light emitting diode is described with reference to the drawings.

FIGS. 2A to 2D are sectional views illustrating the steps of the method for manufacturing the light emitting diode of the first embodiment of the present invention.

In the first embodiment, the crystal growth of a group III nitride semiconductor is carried out by metal organic chemical vapor deposition (MOCVD) using trimethyl gallium (TMG) as a gallium source, trimethyl aluminum (TMA) as an aluminum source, trimethyl indium (TMI) as an indium source and ammonia ($NH_3$) as a group V element source (nitrogen source). Silane ($SiH_4$) containing silicon (Si) is used as an n-type dopant material and cyclopentadienyl magnesium ($CP_2Mg$) containing magnesium (Mg) is used as a p-type dopant material.

Figure 2A:
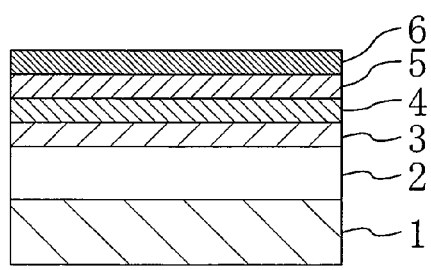
FIGS. 2A to 2D are sectional views illustrating the steps of a method for manufacturing the nitride semiconductor device of the first embodiment of the present invention.

First, as shown in FIG. 2A, on a principal surface of an n-type GaN substrate 1 having a (0001) plane orientation, an n-type GaN layer 2, an n-type cladding layer 3 made of n-type AlGaN, an MQW active layer 4 made of InGaN, a p-type cladding layer 5 made of p-type AlGaN and a first p-type contact layer 6 made of p-type GaN are formed in this order by MOCVD.

The n-type GaN substrate 1 used herein has a (0001) plane as the principal surface. However, the present invention is not limited thereto. For example, a sapphire substrate having a (0001) plane as a principal surface may be used. If the sapphire substrate is used as the n-type substrate 1, a GaN buffer layer may be formed on the n-type substrate 1 at a low temperature of about 500° C. In place of the low temperature grown buffer layer, a relatively thick buffer layer may be formed using aluminum nitride (AlN) which is grown at a high temperature of 1,000° C. or higher.

Optical guide layers made of GaN may be formed to sandwich the MQW active layer 4. Further, an AlGaN layer having an Al composition of 10% or more may be formed between the MQW active layer 4 and the p-type cladding layer 5 in order to improve the temperature characteristic of the light emitting diode. With this configuration, electrons injected into the MQW active layer 4 from the n-type semiconductor layer are prevented from overflowing to the p-type semiconductor layer.

Figure 2C:
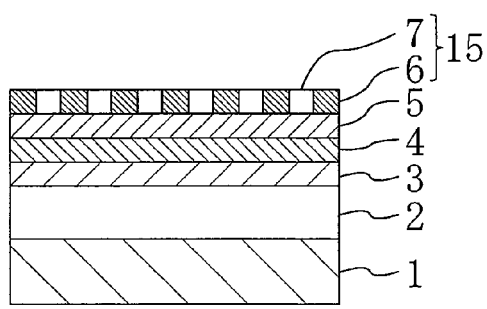
Figure 2B:
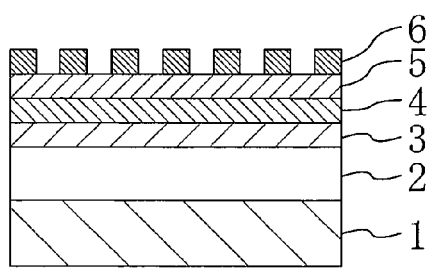

Then, as shown in FIG. 2B, the first p-type contact layer 6 is patterned into plurality of columns by lithography and dry etching, thereby providing protrusions and depressions on the p-type cladding layer 5. During this time a top portion of the p-type cladding layer 5 may be etched together. The dry etching is carried out by inductively coupled plasma etching using, for example, chlorine ($Cl_2$) gas.

Then, as shown in FIG. 2C, a second p-type contact layer 7 made of p-type AlGaNP is selectively grown on the side surfaces of the columns of the first p-type contact layer 6 in the direction parallel to the principal surface of the n-type substrate 1 by MOCVD according to the present invention.

For the crystal growth of the second p-type contact layer 7, it may be desirable to use TMA as an aluminum (group III element) source, TMG as a gallium source, phosphine ($PH_3$) as a phosphorus (group V element) source and asymmetric dimethylhydrazine (DMHy) as a nitrogen source. $CP_2Mg$ may preferably be used as a p-type impurity material.

The inventors of the present invention have confirmed that the decomposition temperature of phosphine is lower than that of ammonia in the conventional MOCVD using ammonia as a nitrogen source, and therefore the phosphorus (P) composition in the AlGaNP crystal becomes larger than the designed value. To be more specific, it is difficult to accurately control the P composition in the AlGaNP crystal by the conventional MOCVD. For this reason, the degree of lattice mismatch with GaN or AlGaN becomes high and the AlGaNP crystal with excellent crystallinity cannot be obtained.

Under these circumstances, the inventors of the present invention have found that with use of asymmetric DMHy as the nitrogen source, AlGaNP is obtained in which the P composition is several % and an AlGaNP layer is provided without crystal defect caused by the lattice mismatch.

Figure 3:
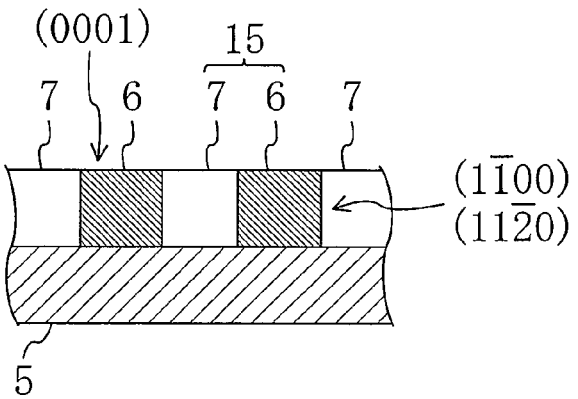
FIG. 3 is an enlarged sectional view partially illustrating first and second p-type contact layers of FIG. 2B during the manufacture of the nitride semiconductor device of the first embodiment of the present invention.

According to the experimental results by the inventors of the present invention, it has also been confirmed that the crystal growth using asymmetric DMHy as the nitrogen source proceeds at a much slower rate on the (0001) plane than on a (11–20), (1–100) or (000–1) plane as shown in an enlarged sectional view of FIG. 3. That is, AlGaNP is hardly grown on the (0001) plane.

Thus, in the first embodiment, the second p-type contact layer 7 made of p-type AlGaNP is formed selectively in the depressions formed in the first p-type contact layer 6, i.e., on the side surfaces of the columns of the first p-type contact layer 6.

If ammonia is used as the nitrogen source according to the conventional manner, hydrogen atoms derived from hydrogen ($H_2$) gas generated by thermal decomposition of ammonia are bonded with Mg dopants, thereby reducing the activation rate of the Mg dopants serving as acceptors. For example, the concentration of carriers in p-type GaN has been about 1×10$^{18}$ cm$^{-3}$ at the maximum. However, if asymmetric DMHy is used as the nitrogen source, the nitride semiconductor layer is grown at a lower temperature as compared with the case where ammonium is used. As a result, the Mg dopants are prevented from re-evaporating, thereby increasing the concentration of the Mg dopants in the crystal. In other words, if asymmetric DMHy is used as the nitrogen source, hydrogen gas is not generated during the growth of the nitrogen semiconductor layer, thereby eliminating the chance of the hydrogen atoms bonding to the Mg dopants. This improves the activation rate of the Mg dopants improves and allows providing the p-type semiconductor layer with reduced resistance and increased carrier concentration.

In the first embodiment, as shown in FIG. 3, the second p-type contact layer 7 is selectively formed to bury the gaps between the columns of the first p-type contact layer 6. However, the second p-type contact layer 7 may be formed to cover the top surfaces of the columns of the first p-type contact layer 6.

Figure 2D:
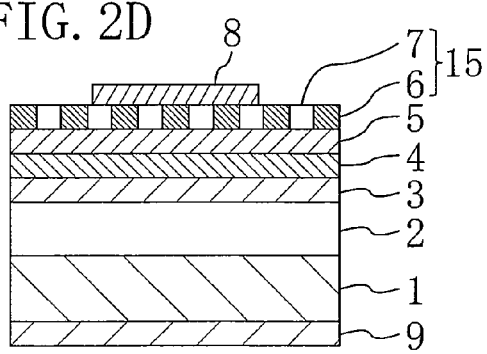

Then, as shown in FIG. 2D, a p-type electrode 8 is formed on the first and second p-type contact layers 6 and 7 and an n-type electrode 9 is formed on the surface of the n-type substrate 1 opposite the n-type GaN layer 2. Thus, a light emitting diode capable of emitting blue or ultraviolet light is fabricated.

According to the first embodiment, the second p-type contact layer 7 made of p-AlGaNP has excellent crystallinity and increased carrier concentration. Therefore, as compared with a conventional nitride semiconductor light emitting diode, this configuration makes it possible to reduce the resistance at a contact with the p-type electrode 8 and the series resistance with a p-type semiconductor layer such as the p-type cladding layer 5. As a result, the operating voltage is further reduced.

In the first embodiment, the second p-type contact layer 7 is made of AlGaNP. However, AlGaNAs may be used as long as a smaller band gap and resistance than those of GaN are given to the resulting p-type contact layer 15. In this case, arsine (AsH$_3$) is used as a group V element source instead of phosphine.

The group V element material for P or As may be an organic group V element material such as tertiary butylphosphine (TBP) or tertiary methylarsine (TMAs) instead of hydrides such as phosphine or arsine. In this case, the composition of P or As is controlled precisely. Further, as compared with the hydrides, the organic group V element material allows the crystal growth at a lower temperature, thereby preventing the deterioration of light emitting efficiency due to dispersion of Mg dopants. Moreover, if aluminum nitride phosphide (AlNP) is used for the second p-type contact layer 7 in place of AlGaNP or AlGaNAs, localized band is created by P in the wide band gap to reduce the resistance of the p-type contact layer 15 to a further extent.

In the first embodiment, as shown in FIG. 1, the p-type second contact layer 7 is formed to bury the gaps between the columns of the first p-type contact layer 6. Since AlGaNP used as the second p-type contact layer 7 has a smaller band gap than that of GaN, it shows a higher refractive index than that of GaN. Therefore, if the columns of the first p-type contact layer 6 are arranged periodically at fine intervals on the p-type cladding layer 5, light emitted from the MQW active layer 4 is more likely to be trapped in the second p-type contact layer 7. That is, a so-called photonic structure is obtained. Thus, the light emitted from the MQW active layer 4 is taken out more easily, thereby improving the light emitting efficiency of the light emitting diode.

Second Embodiment

Hereinafter, explanation of a second embodiment of the present invention is provided with reference to the drawing.

Figure 4:
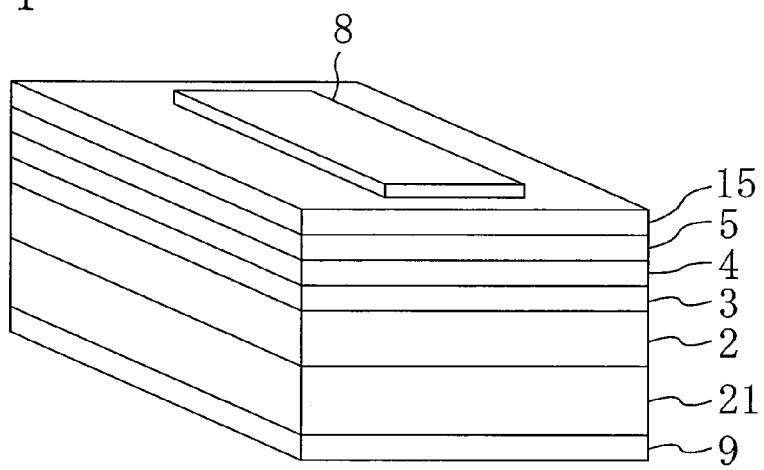
FIG. 4 is an oblique view illustrating a nitride semiconductor device of a second embodiment of the present invention.

FIG. 4 shows a light emitting diode using a nitride semiconductor of the second embodiment of the present invention. In FIG. 4, the same components as those shown in FIG. 1 are indicated by the same reference numerals to omit overlapping explanation.

As shown in FIG. 4, on a principal surface of an n-type GaN semiconductor 21 having a (1–100) plane orientation, an n-type GaN layer 2, an n-type cladding layer 3 made of n-type AlGaN, an MQW active layer 4 made of InGaN, a p-type cladding layer 5 made of p-type AlGaN and a p-type contact layer 15 made of p-type AlGaNP or p-type GaN are formed in this order.

In the second embodiment, the p-type contact layer 15 made of p-type AlGaNP or p-type GaN is formed on a top surface of the p-type cladding layer 5 having a (1–100) plane orientation by MOCVD using asymmetric DMHy as a nitrogen source. With this configuration, the p-type contact layer 15 is provided with reduced residual hydrogen concentration and increased carrier concentration.

Third Embodiment

Hereinafter, explanation of a third embodiment of the present invention is provided with reference to the drawings.

Figure 5:
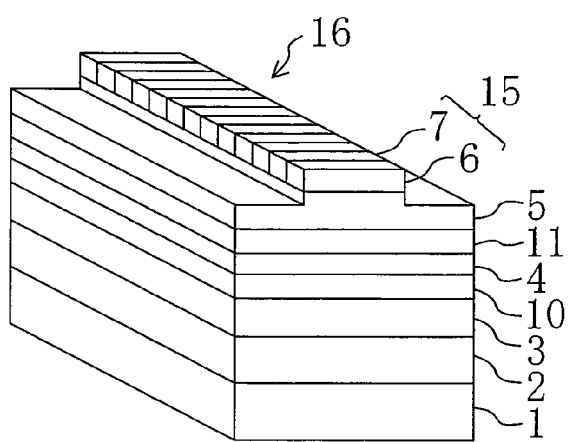
FIG. 5 is an oblique view illustrating a semiconductor laser device as a nitride semiconductor device of a third embodiment of the present invention.

FIG. 5 shows a semiconductor laser device using a nitride semiconductor of the third embodiment of the present invention.

As shown in FIG. 5, on a principal surface of an n-type GaN semiconductor 1 having a (0001) plane orientation, a 3 µm thick n-type GaN layer 2, a 100 nm thick n-type cladding layer 3 made of n-type AlGaN, a 30 nm thick n-type optical guide layer 10 made of n-type GaN, an MQW active layer 4 made of InGaN, a 30 nm thick p-type optical guide layer 11 made of p-type GaN, a 1 µm thick p-type cladding layer 5 made of p-type AlGaN and a 100 nm thick p-type contact layer 15 are formed in this order.

The p-type contact layer 15 and a top portion of the p-type cladding layer 5 are formed into a ridge stripe 16 extending in a certain direction. The p-type contact layer 15 includes a plurality of first p-type GaN contact layers 6 in the form of strips extending in a direction vertical to the certain direction, respectively, and spaced from each other and a second p-type contact layer 7 selectively grown on the side surfaces of the first p-type contact layers 6 opposing each other and made of p-type AlGaNP in which phosphorus (P) is added to the group V element.

Also in this embodiment, an organic nitride material such as asymmetric dimethylhydrazine (DMHy) or asymmetric dibutylhydrazine (DBHy) is used as a nitrogen source for the second p-type contact layer 7 instead of generally used ammonia.

In FIG. 5, a p-type electrode formed on the p-type contact layer 15 and an n-type electrode formed on the surface of the n-type substrate 1 opposite the n-type GaN layer 2 are omitted for easy illustration.

Hereinafter, a method for manufacturing the semiconductor laser device of the third embodiment of the present invention is explained with reference to the drawings.

FIGS. 6A to 6F are sectional views illustrating the steps of the method for manufacturing the semiconductor laser device of the third embodiment of the present invention.

In the third embodiment, just like in the first embodiment, the crystal growth of a group III nitride semiconductor is carried out by MOCVD using TMG as a gallium source, TMA as an aluminum source, TMI as an indium source and $NH_3$ as a nitrogen source. $SiH_4$ and $CP_2Mg$ are used as n- and p-type dopants, respectively.

Figure 6A:
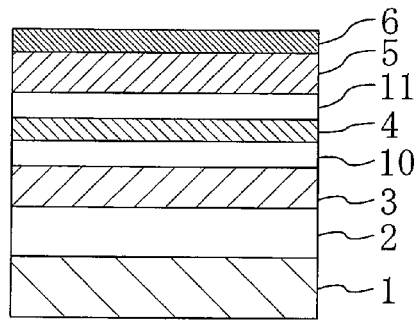
FIGS. 6A to 6D are sectional views illustrating the steps of a method for manufacturing the nitride semiconductor device of the third embodiment of the present invention and FIGS. 6E and 6F are oblique views illustrating the steps of the method for manufacturing the nitride semiconductor device of the third embodiment of the present invention.

First, as shown in FIG. 6A, on a principal surface of an n-type GaN substrate 1 having a (0001) plane orientation, an n-type GaN layer 2, an n-type cladding layer 3 made of n-type AlGaN, an n-type optical guide layer 10 made of n-type GaN, an MQW active layer 4 made of InGaN, a p-type optical guide layer 11 made of p-type GaN, a p-type cladding layer 5 made of p-type AlGaN and a first p-type contact layer 6 made of p-type GaN are formed in this order.

The n-type GaN substrate 1 used herein has a (0001) plane as the principal surface. However, the present invention is not limited thereto. For example, a sapphire substrate having a (0001) plane as a principal surface may be used. If the sapphire substrate is used as the n-type substrate 1, a GaN buffer layer may be formed on the n-type substrate 1 at a low temperature and the n-type GaN layer 2 and the other semiconductor layers may be formed thereon. Further, so-called ELO (epitaxial lateral overgrowth) may be employed, i.e., a silicon oxide ($SiO_2$) mask patterned into stripes is formed on the sapphire substrate and then the semiconductor layers are formed thereon, such that crystal defect density in the semiconductor layers is reduced.

In the third embodiment, the n- and p-type optical guide layers 10 and 11 are formed to sandwich the MQW active layer 4 to improve the effect of trapping light emitted from the MQW active layer 4 in the direction vertical to the n-type substrate 1. Further, an AlGaN layer having an Al composition of 15% or more may be formed between the MQW active layer 4 and the p-type cladding layer 5 such that electrons injected into the MQW active layer 4 from the n-type semiconductor layer are prevented from overflowing to the p-type semiconductor layer.

Figure 6D:
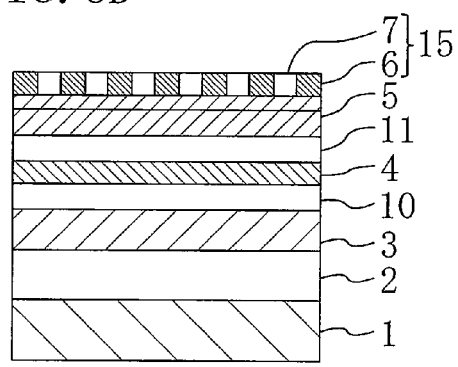
Figure 6B:
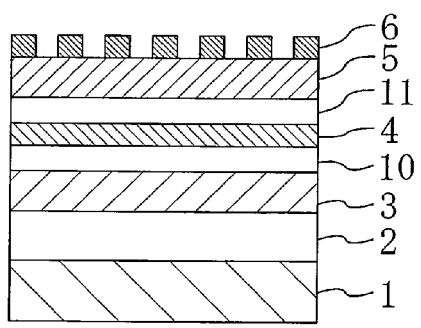

Then, as shown in FIG. 6B, the first p-type contact layer 6 and a top portion of the p-type cladding layer 5 are shaped into a plurality of strips by lithography and inductively coupled plasma dry etching using chlorine gas. Thus, protrusions and depressions are provided on the p-type cladding layer 5. The shape of the first p-type contact layer 6 and the top portion of the p-type cladding layer 5 are not limited to the strips and they may be patterned into columns as described in the first embodiment.

Figure 6E:
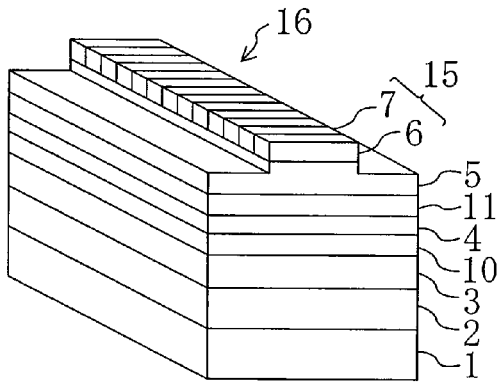
Figure 6C:
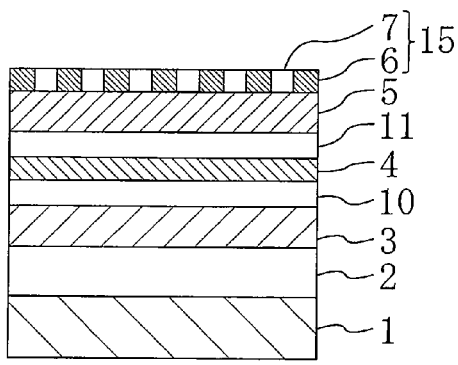

Then, as shown in FIG. 6C, a second p-type contact layer 7 made of p-type AlGaNP is selectively grown on the opposing side surfaces of the strips of the first p-type contact layer 6 in the direction parallel to the principal surface of the n-type substrate 1 by MOCVD according to the present invention. For the crystal growth of the second p-type contact layer 7, in the same manner as in the first embodiment, it may be desirable to use $PH_3$ as a phosphorus (group V element) source and asymmetric DMHy as a nitrogen source. $CP_2Mg$ may preferably be used as a p-type impurity material.

As described above, with use of asymmetric DMHy as a group V element source (nitrogen source), AlGaNP with several % P composition is obtained. This makes it possible to form the second p-type contact layer 7 by crystal growth without crystal defect caused by the lattice mismatch.

The crystal growth using asymmetric DMHy as the nitrogen source proceeds at a much slower rate on the (0001) crystal plane than on a (11–20), (1–100) or (000–1) plane.

Therefore, the second p-type contact layer 7 made of p-type AlGaNP is formed only on the side surfaces of the plurality of first p-type contact layers 6.

The decomposition temperature of asymmetric DMHy is lower than that of $NH_3$. Therefore, the Mg dopants are prevented from re-evaporating from the growth surface of the second p-type contact layer 7. This makes it possible to increase the concentration of the Mg dopants in the second p-type contact layer 7. Further, as hydrogen gas is not generated during the crystal growth of the second p-type contact layer 7, hydrogen atoms are not bonded with the Mg dopants. This improves the activation rate of the Mg dopants, thereby providing the second p-type contact layer 7 with low resistance and high carrier concentration. As a result, the contact resistance with the p-type electrode is reduced and the operating voltage of the semiconductor laser device is also reduced.

In the third embodiment, as shown in FIG. 5, the second p-type contact layer 7 is selectively formed to bury the gaps between the strips of the first p-type contact layer 6. However, the second p-type contact layer 7 may be formed to cover the top surfaces of the strips of the first p-type contact layer 6.

In the same manner as the second embodiment, if the p-type cladding layer 5 is formed to have a (11–20), (1–100) or (000–1) plane as a crystal growth surface (top surface), the p-type contact layer 15 made of p-type AlGaN or p-type AlGaNP may be formed directly on the p-type cladding layer 5.

Then, as shown in FIGS. 6D and 6E, the p-type contact layer 15 and a top portion of the p-type cladding layer 5 are selectively shaped into a ridge stripe 16 by lithography and inductively coupled plasma dry etching.

Figure 6F:
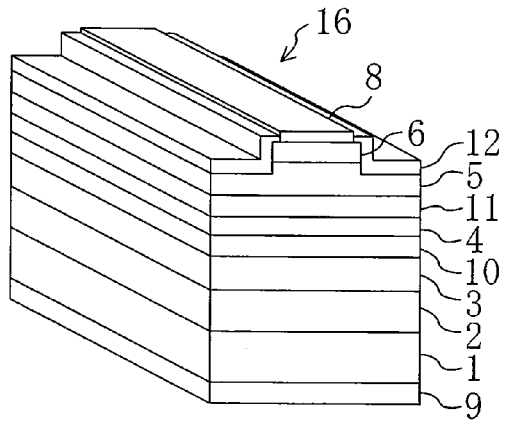

Then, as shown in FIG. 6F, a passivation film 12 made of silicon oxide ($SiO_2$) is formed on the p-type cladding layer 5 to cover the ridge stripe 16. Specifically, the passivation film 12 functions as a blocking layer for trapping light emitted transversely to the n-type substrate 1. Then, an opening is formed in the passivation film 12 by lithography and dry etching to expose the top surface of the ridge stripe 16 and a p-type electrode 8 made of palladium (Pd) is formed in the opening. Then, an n-type electrode 9 made of a stack of titanium (Ti) and aluminum (Al) is formed on the surface of the n-type substrate 1 opposite the n-type GaN layer 2 to complete the semiconductor laser device. The p- and n-type electrodes 8 and 9 may be formed in the reverse order.

The semiconductor laser device of the third embodiment is applicable to a light source having a light emitting wavelength of 405 nm for next-generation high density optical discs.

The second p-type contact layer 7 has a higher refractive index than that of the first p-type contact layer 6. Therefore, if recesses extending in a direction vertical to the direction of extension of the ridge stripe 16 are formed in the first p-type contact layer 6 in a periodic manner to give an optical wavelength cycle, and the second p-type contact layer 7 is grown to fill the recesses, the second p-type contact layer 7 functions as a diffraction grating. Thus, a so-called distributed feedback (DFB) semiconductor laser device is obtained. To be more specific, a semiconductor laser device with excellent wavelength selectivity is achieved without the need of realizing a favorable facet.

In this embodiment, the composition of the second p-type contact layer 7 is AlGaNP. However, the composition may be AlGaAs as described in the first embodiment. The group V element source used to add P and As may be an organic material such as TBP or TMAs in place of phosphine or arsine described above.

With use of AlNP as the second p-type contact layer 7 in place of AlGaNP or AlGaNAs, localized band may be created by P in the wide band gap to reduce the resistance of the p-type contact layer 15 to a further extent.

In the first to third embodiments of the present invention, light emitting diodes and semiconductor laser devices are taken as examples of the semiconductor light emitting device using the nitride semiconductor. However, the present invention is not limited to the semiconductor light emitting devices. For example, the present invention may be applicable to electronic devices such as transistors as long as a p-type nitride semiconductor layer is included. According to the present invention, the resistance of the contact layer made of the p-type nitride semiconductor layer and the contact resistance with the electrode are reduced effectively.

Fourth Embodiment

Hereinafter, explanation of a fourth embodiment of the present invention is provided with reference to the drawings.

Figure 7:
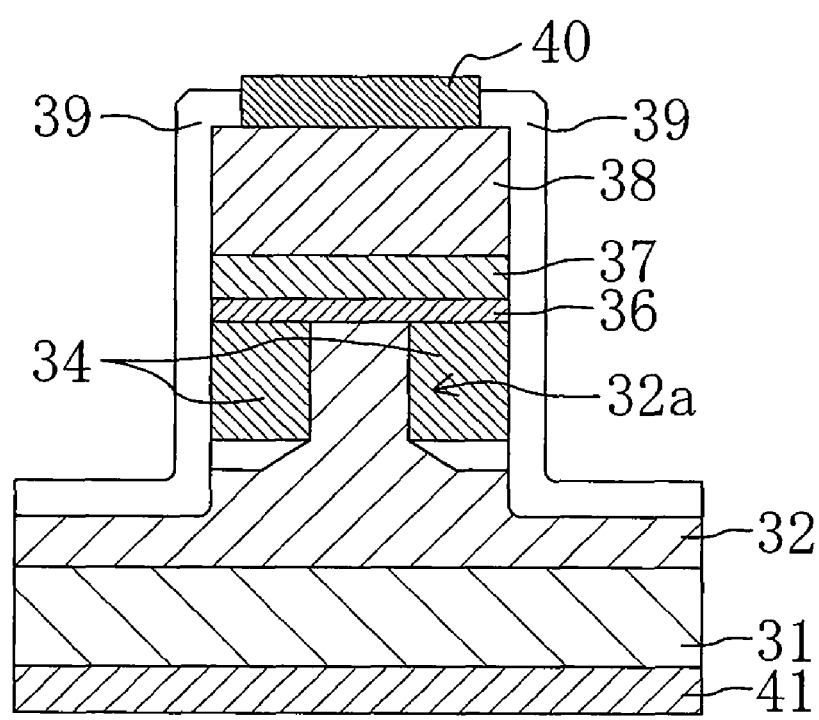
FIG. 7 is a sectional view illustrating a semiconductor laser device as a nitride semiconductor device of a fourth embodiment of the present invention.

FIG. 7 shows a sectional structure of a semiconductor laser device using a nitride semiconductor of the fourth embodiment of the present invention.

As shown in FIG. 7, a semiconductor laser device of the fourth embodiment includes: an n-type substrate 31 made of n-type GaN and having a (0001) plane as a principal surface; an n-type GaN buffer layer 32 formed on the principal surface of the n-type substrate 31 and provided with a ridge stripe 32a of 1 μm high at the top thereof; an overhanging semiconductor layer 34 laterally grown from the side surfaces of the ridge stripe 32a of the n-type buffer layer 32 and made of a nitride semiconductor to function as a current confining layer; a 30 nm thick n-type GaN layer 36 formed on the top surface of the ridge stripe 32a and the top surface of the overhanging semiconductor layer 34; a quantum well active layer 37 made of InGaN and formed on the n-type GaN layer 36; and a 1 μm thick p-type GaN layer 38 formed on the quantum well active layer 37.

Further, a p-type electrode 40 made of Pd is formed on the p-type GaN layer 38 and an n-type electrode 41 made of a stack of Ti and Al is formed on the surface of the n-type substrate 31 opposite the n-type buffer layer 32.

A passivation film 39 made of silicon oxide and capable of trapping light emitted from the quantum well active layer 37 is formed to cover the side surfaces of the p-type GaN layer 38, quantum well active layer 37, n-type GaN layer 36 and overhanging semiconductor layer 34 and parts of the n-type buffer layer 32 exposed on the sides of the ridge stripe 32a.

Hereinafter, explanation of a method for manufacturing the thus-configured semiconductor laser device is provided with reference to the drawings.

FIGS. 8A to 8D are sectional views illustrating the steps of the method for manufacturing the semiconductor laser device of the fourth embodiment of the present invention.

In the fourth embodiment, the crystal growth of a group III nitride semiconductor is carried out by MOCVD using TMG as a gallium source, TMA as an aluminum source, TMI as an indium source and $NH_3$ or asymmetric DMHy as a group III element source (nitrogen source). $SiH_4$ is used as an n-type dopant material and $CP_2Mg$ is used as a p-type dopant material.

Figure 8A:
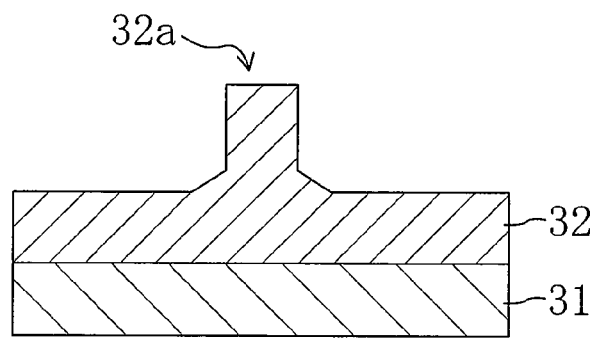
FIGS. 8A to 8D are sectional views illustrating the steps of a method for manufacturing the nitride semiconductor device of the fourth embodiment of the present invention.

First, as shown in FIG. 8A, a 3 μm thick n-type buffer layer 32 made of n-type GaN is formed on a principal surface of an n-type GaN substrate 31 having a (0001) plane orientation. Then, the n-type buffer layer 32 is subjected to lithography and inductively coupled plasma dry etching using chlorine gas to form a ridge stripe 32a having a convex section in a top portion of the n-type buffer layer 32. The ridge stripe 32a is formed to extend in the depth direction of the figure. The side surfaces of the ridge stripe 32a have a plane orientation of (1–100) or (11–20) or a plane direction having an intermediate index between them. The method for forming the ridge stripe 32a is not limited to dry etching. The effect of the present invention is exhibited even if other etching techniques such as wet etching are used.

If the n-type substrate 31 has excellent crystallinity and highly flat principal surface and the n-type dopant concentration is appropriate, the ridge stripe 32a may be formed directly in the n-type GaN substrate 31. By so doing, the step of crystal growth of the n-type buffer layer 32 is omitted and the nitride semiconductor laser device is achieved at a lower cost.

In the fourth embodiment, the n-type buffer layer 32 has a uniform composition. However, the effect of the present invention is exhibited even if the doping concentration or the composition is varied. In particular, if the n-type buffer layer 32 has a short-period superlattice structure made of AlGaN and GaN layers, the current injection efficiency to a further extent because the overflow of the carriers is restrained. This makes it possible to improve the light emitting efficiency of the semiconductor laser device.

Figure 8B:
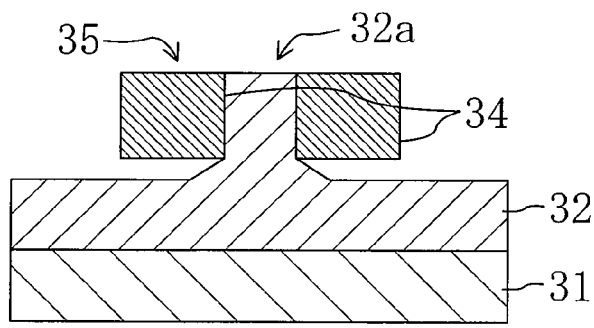

Then, as shown in FIG. 8B, an overhanging semiconductor layer 34 made of a nitride semiconductor and functions as a current blocking layer is selectively grown on the side surfaces of the ridge stripe 32a of the n-type buffer layer 32 by MOCVD using asymmetric DMHy as a nitrogen source.

In general, in order to obtain a high quality active layer by crystal growth, the interface with the underlying layer must be flat at an atomic layer level. In particular, it is well-known that the growth mechanism of the nitride semiconductor on the (0001) plane is greatly varied from that on the other planes. Therefore, it is preferable that the film growth occurs on a single plane. However, by the conventional crystal growth method, the top surface of the nitride semiconductor layer which is grown in the lateral direction (parallel to the principal surface of the n-type substrate 1) does not have a (0001) plane orientation in the entire region.

A drastic solution to this is the method of the present invention in which the nitride semiconductor layer is selectively grown on the side surfaces of the convex portion only. In the selective growth of the present invention, an organic nitride material which is thermally decomposed at a low temperature, such as asymmetric DMHy, is used. With use of such organic nitride material, the crystal growth occurs only on the side surfaces of the convex portion.

Three important points of the selective growth method of the present invention are as follows.

(1) According to this method, the nitride semiconductor layer does not grow on the surface having a (0001) plane orientation even if a mask is not used. Therefore, the nitride semiconductor layer does not grow on the top surface of the n-type buffer layer 32, while it grows on the side surfaces of the convex portion in the lateral direction. Further, as the laterally grown overhanging semiconductor layer 34 does not grow in the direction vertical to the principal surface of the n-type substrate 1, it grows horizontally without exceeding the top surface of the n-type buffer layer 32.

(2) According to this method, the nitride semiconductor layer does not grow on the surface having a (0001) plane orientation. Therefore, even if the (0001)-oriented surface has irregularity, the nitride semiconductor layer grows to bury the irregularity. As a result, the (0001)-oriented surface is made flat at an atomic layer level.

(3) Since parts of the n-type buffer layer 32 on the sides of the ridge stripe 32a also have a (0001) plane orientation, the nitride semiconductor never grows on these parts, as not on the top surface. Therefore, depending on the growth conditions, a gap may be formed in a self-organized manner between the overhanging semiconductor layer 34 and these parts of the n-type buffer layer 32 on the sides of the ridge stripe 32a.

According to the above-described three features, an interface 35 formed by the top surface of the ridge stripe 32a and the top surface of the overhanging semiconductor layer 34 is made flat at the atomic layer level. Further, the overhanging semiconductor layer 34 is selectively grown from the side surfaces of the ridge stripe 32a in the lateral direction only.

If the overhanging semiconductor layer 34 has a p-type conductivity, a depletion layer is formed between the overhanging semiconductor layer 34 and the side surfaces of the ridge stripe 32a. Therefore, the flow of injected current is narrowed with efficiency. In particular, if asymmetric DMHy is used as a nitrogen source to selectively grow the overhanging semiconductor layer 34, DMHy eliminates hydrogen from mixing into the nitrogen semiconductor crystal. This is because highly reactive methyl or amino group radicals are generated during the thermal decomposition of DMHy and they are bonded preferentially with hydrogen to prevent the mixing of hydrogen into the crystal. Accordingly, as compared with the case where ammonia is used as the nitrogen source, the residual hydrogen concentration in the overhanging semiconductor layer 34 is significantly reduced. Therefore, the concentration of holes is further increased and the current confining function is enhanced. This makes it possible to achieve a laser device with high light emitting efficiency. Further, as the residual hydrogen in the overhanging semiconductor layer 34 is reduced, there is no need of annealing the layer after the crystal growth.

If insulating material is used for the overhanging semiconductor layer 34, the injected current flows mostly in the n-type buffer layer 32. As the overhanging semiconductor layer 34 narrows the injected current flow, the light emitting efficiency of the semiconductor laser device is improved. Even if the overhanging semiconductor layer 34 is made of material having a larger band gap than that of the n-type buffer layer 32, the effect of the present invention is surely exhibited. Examples of the material having a larger band gap than that of the n-type buffer layer 32 include AlGaN and InAlGaN. If InAlGaN is used, the obtained crystal is less distorted because the lattice constant of InAlGaN is matched with that of GaN. If the material having a larger band gap used for the overhanging semiconductor layer 34 is an insulating material or a p-type semiconductor, the function of narrowing the current flow is further improved, thereby enhancing the light emitting efficiency of the semiconductor laser device to a further extent.

The side surfaces of the ridge stripe 32a include a surface vertical to the principal surface of the n-type substrate 31 and an inclined surface. In such a case, the overhanging semiconductor layer 34 grows faster on the surface vertical to the (0001)-oriented principal surface of the n-type substrate 31, e.g., a surface having a (11–20) plane direction, while it grows slowly or does not grow on the inclined surface having an almost (0001) plane direction. Therefore, as shown in FIG. 8B, a gap is formed between the bottom surface of the overhanging semiconductor layer 34 and the n-type buffer layer 32. Thus, as the overhanging semiconductor layer 34 is formed to protrude laterally from the side surfaces of the ridge stripe 32a, leakage current and parasitic capacitance are further reduced.

Figure 8C:
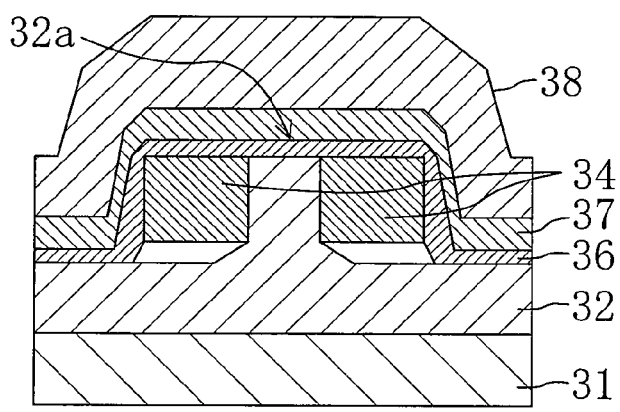

Then, as shown in FIG. 8C, an n-type GaN layer 36, a quantum well active layer 37 made of InGaN including a light confining layer and a p-type GaN layer 38 are formed in this order on the n-type buffer layer 32 to cover the top surfaces of the ridge stripe 32a and the overhanging semiconductor layer 34 by MOCVD using ammonia as a nitrogen source. In this embodiment, the active layer has a quantum well structure. However, this is not obligatory and a bulk layer may also be used without deteriorating the effect of the present invention. Even if the composition of the quantum well active layer 37 is InGaN added with Al, the effect of the present invention is surely exhibited.

The method for crystal growth of the n-type GaN layer 36, quantum well active layer 37 and p-type GaN layer 38 is not limited to MOCVD and molecular-beam epitaxy may also be used.

If a crystal growth apparatus for MOCVD capable of feeding DMHy and $NH_3$ as a nitrogen source is used, there is no need of using a mask according to the selective growth method of the present invention. Therefore, the selective growth of the overhanging semiconductor layer 34 and the following crystal growth of the n-type GaN layer 36 and the like are performed continuously. This leads to further reduction in cost.

If $NH_3$ is used as the nitrogen source, the nitride semiconductor layer grows not only on the underlayer having a (0001) plane orientation but also on the underlayers having other plane orientations.

Figure 8D:
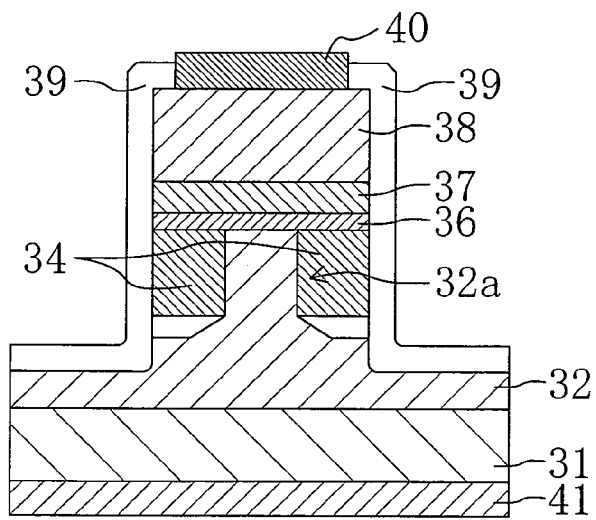

Then, as shown in FIG. 8D, mesa etching is carried out for electrical isolation of the device by dry etching. To be more specific, parts of the p-type GaN layer 38, quantum well active layer 37, n-type GaN layer 36, overhanging semiconductor layer 34 and n-type buffer layer 32 on the sides of the ridge stripe 32a are etched away. Then, a passivation film 39 for surface protection is formed to cover the top and side surfaces of the p-type GaN layer 38, the side surfaces of the quantum well active layer 37, n-type GaN layer 36 and overhanging semiconductor layer 34 and the exposed parts of the n-type buffer layer 32. Further, part of the passivation film 39 is removed selectively by lithography to expose the top surface of the p-type GaN layer 38 and a p-type electrode 40 is formed on the exposed part of the p-type GaN layer 38 by vacuum deposition. An n-type electrode 41 is then formed on the surface of the n-type substrate 31 opposite the n-type buffer layer 32 by vacuum deposition. Thus, the semiconductor laser device is completed. The p- and n-type electrodes 40 and 41 may be formed in a reverse order.

As described above, according to the fourth embodiment, the overhanging semiconductor layer 34 is formed below the quantum well active layer 37 as a current confining layer. Therefore, current injection to the quantum well active layer 37 is efficiently carried out, while the current injected from outside is prevented from dispersing in the lateral direction.

According to the method of the fourth embodiment, there is no need of etching the p-type GaN layer 38 formed on the quantum well active layer 37. Therefore, the p-type electrode 40 of relatively large area is formed on the p-type GaN layer 38 which is never damaged. This makes it possible to significantly reduce the series resistance of the device, thereby reducing power consumption and improving reliability of the device.

According to the fourth embodiment, the n-type semiconductor layer is formed on one side of the quantum well active layer 37 closer to the n-type substrate 31 and the p-type semiconductor layer is formed on the other side opposite the n-type substrate 31. However, the p-type semiconductor layer may be formed on the side of the quantum well active layer closer to the n-type substrate 31 and the n-type semiconductor layer may be formed on the other side opposite the n-type substrate 31.

The overhanging semiconductor layer 34 may be selectively grown such that the band gap continuously increases in a direction away from the ridge stripe 32a. By so doing, the refractive index distribution is continuously varied in the lateral direction. Therefore, a graded-index optical waveguide is obtained. Thus, a waveguide with efficient light confining function is achieved.

If the lattice constant of the overhanging semiconductor layer 34 and that of the n-type buffer layer 32 are different from each other and AlGaN is used for the overhanging semiconductor layer 34, the quantum well active layer 37 is distorted by the underlying overhanging semiconductor layer 34, though the quantum well active layer 37 formed by crystal growth on the interface 35 with the overhanging semiconductor layer 34 is consisted of the same material in the in-plane direction. The distortion causes modulation in a band structure of the quantum well active layer 37. Therefore, in a region above the overhanging semiconductor layer 34 grown on the side surfaces of the ridge stripe 32a, the wavelength of light emitted from the quantum well active layer 37 is shifted to the shorter side. To be more specific, the carriers in the quantum well active layer 37 flow into a region above the ridge stripe 32a due to the energy gradient. At the same time, light absorption is reduced in part of the quantum well active layer 37 above the overhanging semiconductor layer 34. As a result, the semiconductor laser device improves the light emitting efficiency and reduces the power consumption.

[First Modification of Fourth Embodiment]

Hereinafter, explanation of a method for manufacturing a semiconductor laser device as a first modification of the fourth embodiment of the invention is provided with reference to the drawings.

Figure 9:
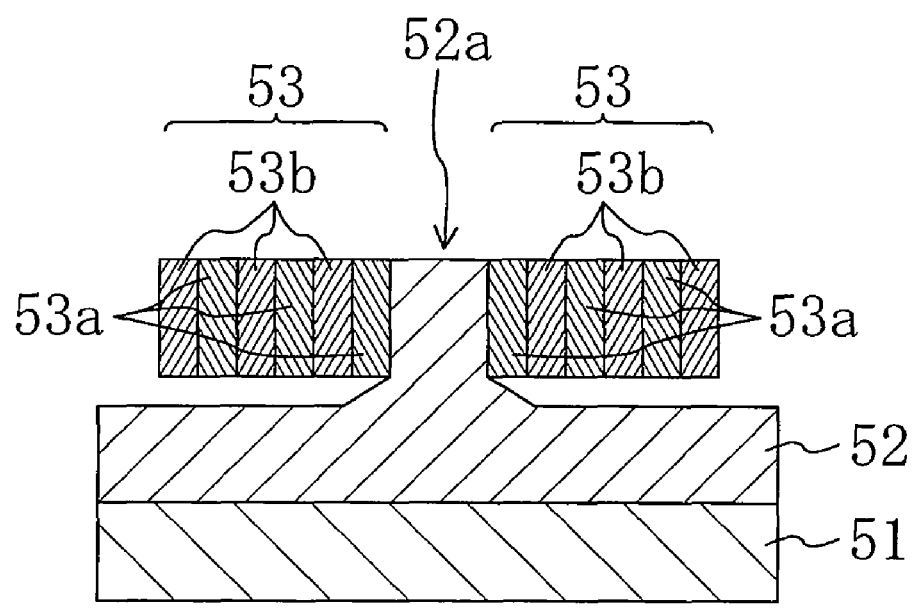
FIG. 9 is a sectional view illustrating one of the steps of a method for manufacturing a first modification of the nitride semiconductor device of the fourth embodiment of the present invention.

According to the selective growth method of the present invention, the overhanging semiconductor layer is grown on the side surfaces of the convex portion in the lateral direction only. Therefore, it may be possible to obtain an overhanging semiconductor layer 53 as shown in FIG. 9 by alternately stacking a plurality of nitride semiconductor layers of different compositions in the lateral direction.

To be more specific, on a principal surface of an n-type GaN substrate 51 having a (0001) plane orientation, an n-type buffer layer 52 made of n-type GaN is formed and a top portion of the n-type buffer layer 52 is shaped into a ridge stripe 52a. Then, an overhanging semiconductor layer 53 is formed on the side surfaces of the ridge stripe 52a. The overhanging semiconductor layer 53 is formed by alternately stacking p-type AlGaN layers 53a and GaN layers 53b in the lateral direction. With this configuration, electrons flowing through the n-type buffer layer 52 cannot flow into the overhanging semiconductor layer 53. Therefore, the overhanging semiconductor layer 53 having excellent current confining effect is obtained.

In the first modification described above, the p-type AlGaN layer 53a may be insulative. Even if the AlGaN layer 53a is insulative, it is possible to obtain the current confining effect. In particular, if the p-type AlGaN layer 53a and the GaN layer 53b are about 10 nm thick, respectively, the overhanging semiconductor layer 53 shows a superlattice structure extending in the lateral direction. This makes it possible to increase the p-type dopant concentration in the overhanging semiconductor layers 53, thereby increasing the efficiency in narrowing the current flow by the overhanging semiconductor layer 53 to a further extent.

[Second Modification of Fourth Embodiment]

Hereinafter, explanation of a method for manufacturing a semiconductor laser device as a second modification of the fourth embodiment of the present invention is provided with reference to FIGS. 10A to 10D.

Figure 10A:
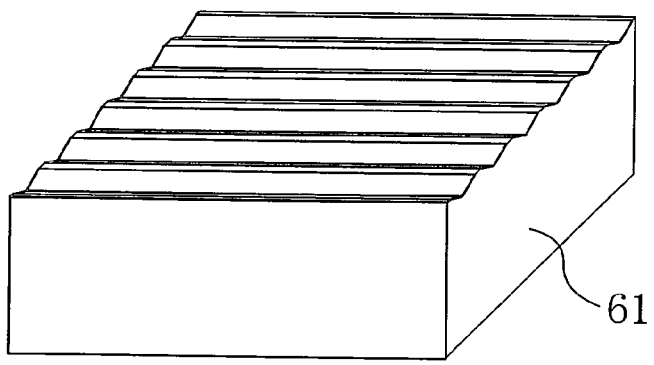
FIGS. 10A to 10C are oblique views illustrating the steps of a method for manufacturing a second modification of the nitride semiconductor device of the fourth embodiment of the present invention.

First, as shown in FIG. 10A, a principal surface of an n-type GaN substrate 61 having a (0001) plane orientation is subjected to light exposure or electron beam exposure and dry etching using chlorine gas to form protrusions and depressions in the principal surface. Alternatively, a n-type GaN buffer layer may be formed on the n-type substrate 61 and then the protrusions and depressions may be formed in the top surface of the buffer layer.

Figure 10B:
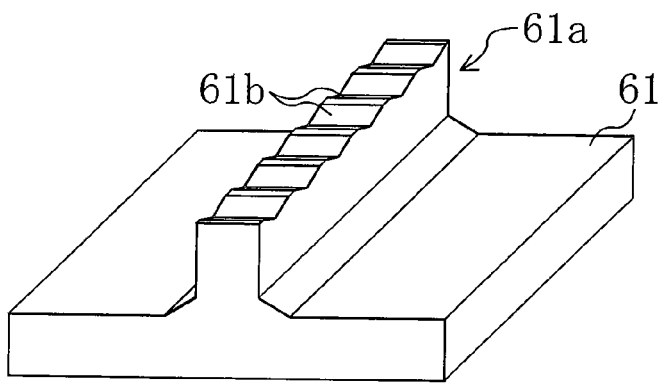

Then, as shown in FIG. 10B, an upper portion of the n-type substrate 61 having the protrusions and depressions in the top surface is shaped into a ridge stripe 61a by lithography and dry etching using chlorine gas. The side surfaces of the ridge stripe 61a and inclined surfaces 61b on the top surface of the ridge stripe 61a do not have a (0001) plane direction.

Figure 10C:
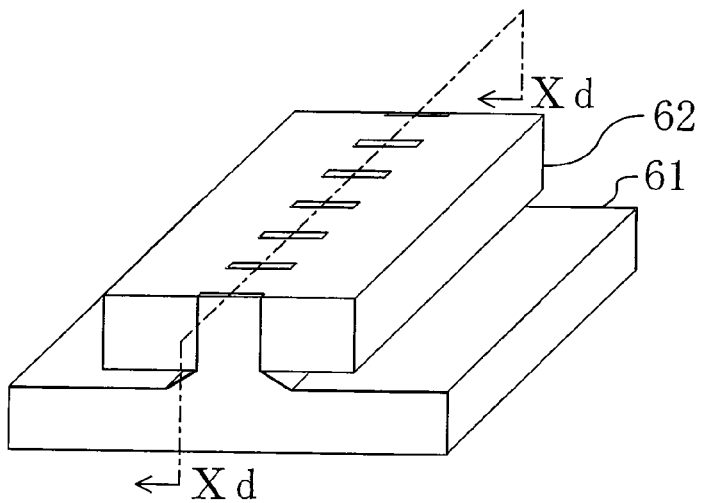
Figure 10D:
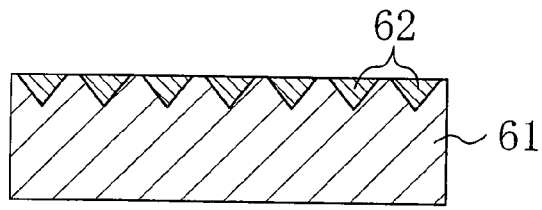
FIG. 10D is a sectional view taken along the line Xd-Xd of FIG. 10C.

Then, as shown in FIG. 10C, an overhanging semiconductor layer 62 made of AlGaN is selectively grown on the side surfaces of the ridge stripe 61a of the n-type substrate 61 by MOCVD using asymmetric DMHy as a nitrogen source. In this step, the overhanging semiconductor layer 62 is laterally grown from the side surfaces of the ridge stripe 61a, and at the same time, it is also grown on the inclined surfaces 61b on the top of the ridge stripe 61a because the side surfaces and the inclined surfaces do not have a (0001) plane orientation. Specifically, the overhanging semiconductor layer 62 is grown to bury the inclined surfaces 61b on the top of the ridge stripe 61a until the plane orientation of the crystal growth surface agrees with the (0001) plane. At this time, the top surfaces of the n-type substrate 61 having a (0001) plane orientation are exposed out of the top surface of the AlGaN overhanging semiconductor layer 62 to be spaced from each other. FIG. 10D is a sectional view taken along the line Xd-Xd of FIG. 10C.

According to the second modification described above, the overhanging semiconductor layer 62 also grows on the inclined surfaces 61b formed on the top of the ridge stripe 61a and the growth of the overhanging semiconductor layer 62 stops at the topmost surface of the ridge stripe 61a. Therefore, the resulting top surface after the growth of the overhanging semiconductor layer 62 is made flat at the atomic layer level.

After that, in the same manner as the fourth embodiment, a double heterostructure including an active layer is formed by crystal growth on the ridge stripe 61a and the overhanging semiconductor layer 62 and p- and n-type electrodes are formed to complete the semiconductor laser device.

According to the second modification, the overhanging semiconductor layer 62 made of AlGaN has a smaller refractive index than that of the n-type substrate 61 made of n-type GaN. Therefore, a periodic structure provided by the protrusions and depressions in the top surface of the ridge stripe 61a reflects light of wavelength that satisfies the Bragg condition. As a result, laser oscillation at a single wavelength is generated with excellent wavelength selectivity.

The overhanging semiconductor layer 62 made of AlGaN has a larger band gap than that of the n-type substrate 61 made of n-type GaN. Therefore, injected current flows through the n-type substrate 61. As a result, periodic optical gain is obtained and wavelength selectivity is provided. This also makes it possible to achieve the laser oscillation at a single wavelength.

Thus, with the provision of the periodic uneven structure on the top of the ridge stripe 61*a*, a semiconductor laser device excellent in monochromatic laser characteristic is obtained.

[Third Modification of Fourth Embodiment]

Hereinafter, explanation of a method for manufacturing a semiconductor laser device as a third modification of the fourth embodiment of the present invention is provided with reference to FIG. 11.

Figure 11:
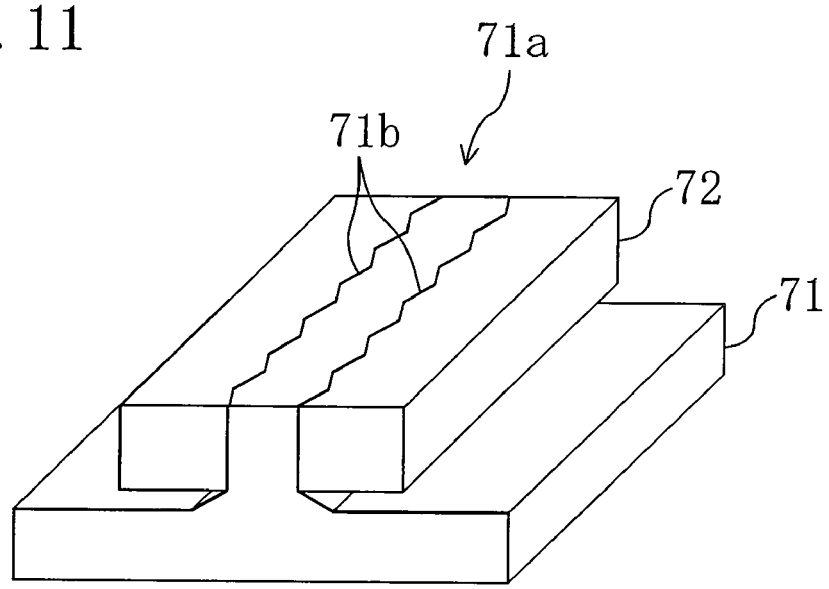
FIG. 11 is an oblique view illustrating one of the steps of a method for manufacturing a third modification of the nitride semiconductor device of the fourth embodiment of the present invention.

As shown in FIG. 11, the semiconductor laser device of the third modification includes an n-type buffer layer 71 made of n-type GaN and a top portion of which is shaped into a ridge stripe 71*a*. The ridge stripe 71*a* has corrugated side surfaces 71*b*. An overhanging semiconductor layer 72 made of AlGaN is selectively grown on the corrugated side surfaces 71*b* of the ridge stripe 71*a*.

After that, in the same manner as the fourth embodiment, a double heterostructure including an active layer is formed by crystal growth on the ridge stripe 71*a* and the overhanging semiconductor layer 72 and p- and n-type electrodes are formed to complete the semiconductor laser device.

As described above, the refractive indices of AlGaN and GaN are different from each other. Therefore, the refractive index is modulated in part of the active layer above the ridge stripe 71*a* due to the periodic structure by the ridge stripe 71*a* and the overhanging semiconductor layer 72. For this reason, the equivalent refractive index is periodically modulated in the vicinity of the interface between the ridge stripe 71*a* and the overhanging semiconductor layer 72. As a result, light of wavelength that satisfies the Bragg condition is intensely reflected. Thus, laser oscillation is achieved with excellent monochromaticity.

In the third modification, the corrugated side surfaces 71*b* of the ridge stripe 71*a* which allow periodical refractive index modulation are provided in the step of forming the ridge stripe 71*a*. Therefore, a single wavelength laser device is achieved at low cost.

[Fourth Modification of Fourth Embodiment]

Hereinafter, explanation of a method for manufacturing a semiconductor laser device as a fourth modification of the fourth embodiment of the present invention is provided with reference to FIG. 12.

Figure 12:
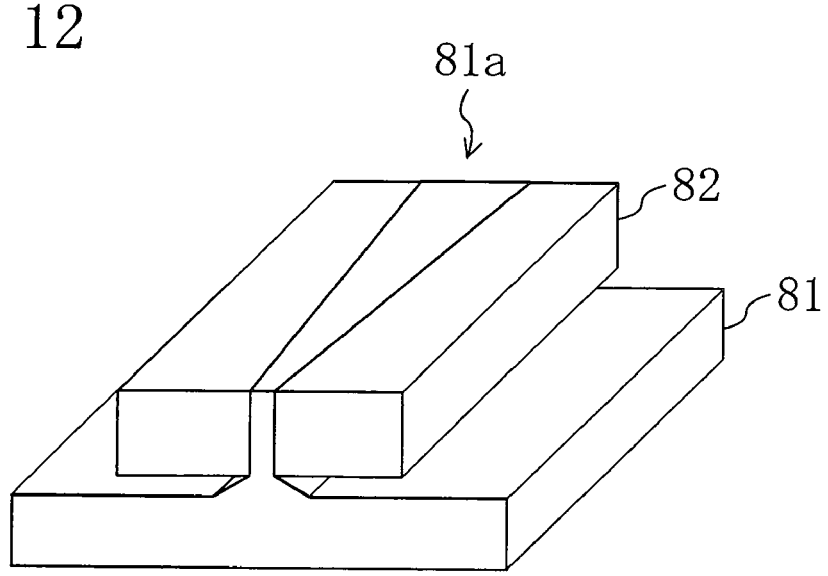
FIG. 12 is an oblique view illustrating one of the steps of a method for manufacturing a fourth modification of the nitride semiconductor device of the fourth embodiment of the present invention.

As shown in FIG. 12, the semiconductor laser device of the fourth modification includes an n-type buffer layer 81 made of n-type GaN and a top portion of which is shaped into a ridge stripe 81*a*. The ridge stripe 81*a* is tapered such that its width is continuously varied in the direction of extension of the ridge stripe 81*a*. Then, an overhanging semiconductor layer 82 made of AlGaN is selectively grown on the side surfaces of the tapered ridge stripe 71*a*.

After that, in the same manner as the fourth embodiment, a double heterostructure including an active layer is formed by crystal growth on the ridge stripe 81*a* and the overhanging semiconductor layer 82 and p- and n-type electrodes are formed to complete the semiconductor laser device.

According to the fourth modification, a front part of the ridge stripe 81*a* with a small width exhibits less light confining effect. Therefore, light emitted from the active layer seeps into the overhanging semiconductor layer 82 surrounding the ridge stripe 81*a*, i.e., modal distribution occurs. Thus, the angle of light emitted from the front part of the ridge stripe 81*a* becomes small.

On the other hand, a rear part of the ridge stripe 81*a* with a large width exhibits great light confining effect, thereby obtaining high optical gain.

Thus, by changing the configuration of the ridge stripe 81*a* and selectively growing the overhanging semiconductor layer on the side surfaces of the ridge stripe 81*a*, reduced light emission angle and high optical gain are achieved with ease.

[Fifth Modification of Fourth Embodiment]

Figure 13:
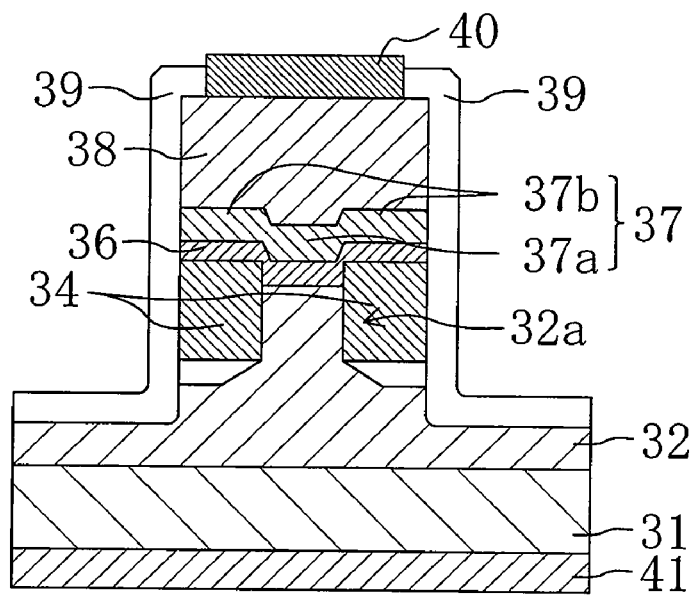
FIG. 13 is a sectional view illustrating a fifth modification of the nitride semiconductor device of the fourth embodiment of the present invention.
Figure 14:
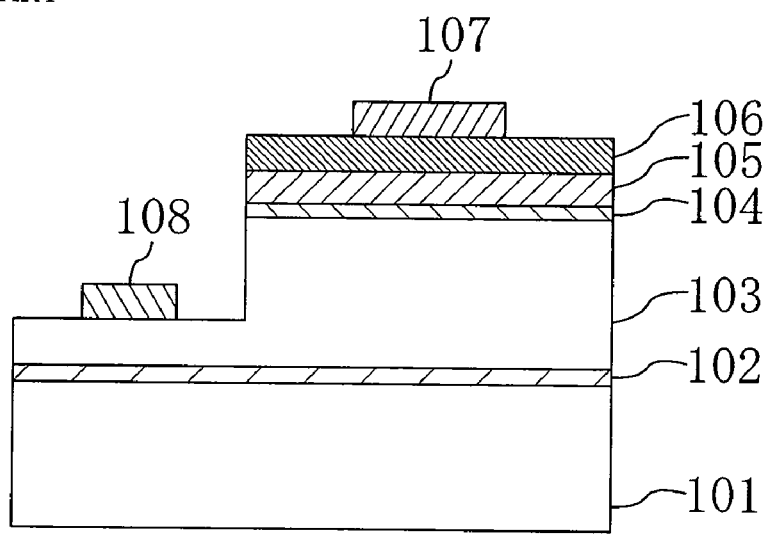
FIG. 14 is a sectional view a first conventional example of a light emitting diode using a nitride semiconductor.

Hereinafter, explanation of a semiconductor laser device as a fifth modification of the fourth embodiment of the present invention is provided with reference to FIG. 13. In FIG. 13, the same components as those shown in FIG. 7 are indicated by the same reference numerals to omit overlapping explanation.

According to the selective growth method of the present invention, the top surface of the convex portion (ridge stripe) and the top surface of the overhanging semiconductor layer are always flush with each other. However, if level difference is intentionally provided between the top surface of the overhanging semiconductor layer and the top surface of the convex portion after the overhanging semiconductor layer is formed, the characteristics of the resulting device are effectively improved.

The difference between the semiconductor laser device shown in FIG. 13 and that shown in FIG. 7 is that the top surface of a ridge stripe 32*a* of an n-type buffer layer 32 is not flush with the top surface of the overhanging semiconductor layer 34, thereby causing level difference in an n-type GaN layer 36 and a quantum well active layer 37 formed thereon.

The level difference is provided by heating the n-type buffer layer 32 and the overhanging semiconductor layer 34 in an ammonia atmosphere after the selective growth of the overhanging semiconductor layer 34 and before the growth of the n-type GaN layer 36. When heated in the ammonia atmosphere, the n-type buffer layer 32 is etched faster than the overhanging semiconductor layer 34. Therefore, the top surface of the ridge stripe 32*a* becomes lower than the top surface of the overhanging semiconductor layer 34.

During the etching of the top surfaces of the ridge stripe 32*a* and the overhanging semiconductor layer 34, i.e., the interface on which the n-type GaN layer 36 will be formed, impurities such as oxygen and carbon are removed from the interface. Therefore, the quality of the interface is improved.

Further, as shown in FIG. 13, the quantum well active layer 37 is configured such that its center portion 37*a* located above the ridge stripe 32*a* is lower than the side portions 37*b* located above the overhanging semiconductor layer 34. This structure makes it possible to pass the narrowed flow of current into the center portion 37*a* with efficiency, thereby improving the light emitting efficiency of the semiconductor laser device.

During the crystal growth, the layer generally grows faster in the recessed portion. Therefore, the thickness of the center portion 37*a* of the quantum well active layer 37 becomes smaller than that of the side portions 37*b*. Therefore, absorption edge wavelength of the side portions 37*b* of the quantum well active layer 37 becomes shorter than that of the center portion 37*a*. As a result, the refractive index and the light absorption are both reduced in the side portions 37*b* of the quantum well active layer 37, thereby improving the light emitting efficiency of the semiconductor laser device to a further extent.

As described above, according to the semiconductor light emitting device and a method for manufacturing the same according to the present invention, a p-type contact layer made of a nitride semiconductor is reduced in resistance and a semiconductor laser device with a current confining structure is obtained without shaping a p-type semiconductor into a ridge shape. Therefore, a nitride semiconductor device capable of operating at low voltage is achieved. This is effective for reducing the operating voltage and increasing the lifetime of a light emitting diode or a semiconductor laser device.

What is claimed is:

1. A method for manufacturing a nitride semiconductor device comprising the steps of:
    forming a first nitride semiconductor layer on a principal surface of a substrate;
    forming one or more convex portions in at least a top portion of the first nitride semiconductor layer; and
    selectively growing a second nitride semiconductor layer on the side surfaces of the one or more convex portions of the first nitride semiconductor layer in a direction substantially parallel to the principal surface of the substrate, after the step of forming the one or more convex portions, wherein in the step of selectively growing the second nitride semiconductor layer, the second nitride semiconductor layer is grown mainly on side surfaces of the one or more convex portions of the first nitride semiconductor layer, and is hardly grown on a surface substantially parallel to the principal surface of the substrate.

2. The method of claim 1, wherein
    the side surfaces of the one or more convex portions of the first nitride semiconductor layer have a (000–1), (11–20) or (1–100) plane orientation.

3. The method of claim 1, wherein
    the first and second nitride semiconductor layers have a p-type conductivity, and at least one of phosphorus and arsenic is added to the second nitride semiconductor layer during the step of forming the second nitride semiconductor layer.

4. The method of claim 3, wherein
    an organic phosphorus material is used as a phosphorus source and an organic arsenic material is used as an arsenic source in the step of forming the second nitride semiconductor layer.

5. The method of claim 1, wherein
    in the step of forming the first nitride semiconductor layer on the substrate, the principal surface of the substrate has a (000–1), (11–20) or (1–100) plane orientation, and
    wherein in the step of growing the second nitride semiconductor layer, an organic nitride material is used as a nitrogen source after the step of forming the first nitride semiconductor layer.

6. The method of claim 5, wherein
    the first and second nitride semiconductor layers have a p-type conductivity, and at least one of phosphorus and arsenic is added to the second nitride semiconductor layer in the step of forming the second nitride semiconductor layer.

7. The method of claim 6, wherein
    an organic phosphorus material is used as a phosphorus source, and an organic arsenic material is used as an arsenic source in the step of forming the second nitride semiconductor layer.

8. The method of claim 5, wherein the organic nitride material is asymmetric dimethylhydrazine or asymmetric dibutylhydrazine.

9. The method of claim 1, wherein
    in the step of selectively growing the second nitride semiconductor layer, a growth direction of the second nitride semiconductor layer is substantially parallel to the principal surface of the substrate in the substantially entire region of the second nitride semiconductor layer.

10. The method of claim 1, wherein
    in the step of selectively growing the second nitride semiconductor layer, an organic nitride material is used as a nitrogen source.

11. The method of claim 10, wherein
    the organic nitride material is asymmetric dimethylhydrazine or asymmetric dibutylhydrazine.

12. The method of claim 1, wherein
    dislocations in the second nitride semiconductor layer extend in the direction substantially parallel to the principal surface of the substrate.

* * * * *